(12) United States Patent
Nurani et al.

(10) Patent No.: US 11,088,039 B2
(45) Date of Patent: Aug. 10, 2021

(54) DATA MANAGEMENT AND MINING TO CORRELATE WAFER ALIGNMENT, DESIGN, DEFECT, PROCESS, TOOL, AND METROLOGY DATA

(71) Applicant: Applied Materials, Inc., Santa Clara, CA (US)

(72) Inventors: Raman K. Nurani, Chennai (IN); Anantha R. Sethuraman, Palo Alto, CA (US); Koushik Ragavan, Chennai (IN); Karanpreet Aujla, Greenbrae, CA (US)

(73) Assignee: Applied Materials, Inc., Santa Clara, CA (US)

(*) Notice: Subject to any disclaimer, the term of this patent is extended or adjusted under 35 U.S.C. 154(b) by 65 days.

(21) Appl. No.: 16/151,046

(22) Filed: Oct. 3, 2018

(65) Prior Publication Data

US 2019/0122944 A1 Apr. 25, 2019

Related U.S. Application Data

(60) Provisional application No. 62/575,878, filed on Oct. 23, 2017.

(51) Int. Cl.
*G05B 13/04* (2006.01)
*H01L 21/66* (2006.01)
*H01L 21/67* (2006.01)
*G05B 19/418* (2006.01)

(52) U.S. Cl.
CPC ............ *H01L 22/34* (2013.01); *G05B 13/048* (2013.01); *G05B 19/4184* (2013.01); *H01L 21/67253* (2013.01); *H01L 22/20* (2013.01); *G05B 2219/32075* (2013.01); *G05B 2219/32224* (2013.01); *G05B 2219/37224* (2013.01); *H01L 21/67288* (2013.01)

(58) Field of Classification Search
CPC ... H01L 22/34; H01L 22/20; H01L 21/67253; H01L 21/67288; G05B 19/4184; G05B 13/048; G05B 2219/37224; G05B 2219/32224; G05B 2219/32075
See application file for complete search history.

(56) References Cited

U.S. PATENT DOCUMENTS

| 6,751,519 B1 * | 6/2004 | Satya | H01L 22/20 |
| | | | 700/109 |
| 2003/0097228 A1 * | 5/2003 | Satya | G01R 31/287 |
| | | | 702/82 |

(Continued)

*Primary Examiner* — Jason Lin
(74) *Attorney, Agent, or Firm* — Patterson + Sheridan, LLP

(57) ABSTRACT

Implementations described herein generally relate to improving silicon wafer manufacturing. In one implementation, a method includes receiving information describing a defect. The method further includes identifying a critical area of a silicon wafer and determining the probability of the defect occurring in the critical area. The method further includes determining, based on the probability, the likelihood of an open or a short occurring as a result of the defect occurring in the critical area. The method further includes providing, based on the likelihood, predictive information to a manufacturing system. In some embodiments, corrective action may be taken based on the predictive information in order to improve silicon wafer manufacturing.

21 Claims, 5 Drawing Sheets

(56) References Cited

U.S. PATENT DOCUMENTS

| | | | |
|---|---|---|---|
| 2004/0176868 A1* | 9/2004 | Haga .................... | G05B 19/418 700/121 |
| 2008/0209365 A1* | 8/2008 | Riviere-Cazaux ...... | G06F 30/39 716/136 |
| 2018/0196911 A1* | 7/2018 | Chang .................. | G01R 31/287 |
| 2018/0275523 A1* | 9/2018 | Biafore ................ | G01N 21/956 |

* cited by examiner

DATA MANAGEMENT AND MINING TO CORRELATE WAFER ALIGNMENT, DESIGN, DEFECT, PROCESS, TOOL, AND METROLOGY DATA

CROSS-REFERENCE TO RELATED APPLICATION

This application claims the benefit of U.S. Provisional Application No. 62/575,878, filed Oct. 23, 2017, which is hereby incorporated by reference in its entirety.

BACKGROUND

Field

Implementations described herein generally relate to using design, process, defect, and metrology data to improve silicon wafer manufacturing.

Description of the Related Art

Manufacturing silicon wafers involves a series of steps, which may include lithography, etching, deposition, and planarization, each of which may be repeated for a plurality of layers. Lithography generally involves an alignment process performed by a lithography tool (e.g., run by precise motors on a stage) which ensures correct alignment of the various layers with one another. Typically, overlay marks are utilized in the layers to assist in the alignment of features in different layers. Defects in the manufacturing process, such as improper alignment, can require expensive corrective action such as stripping and re-coating one or more layers.

Therefore, there is a need in the art for improved techniques of predicting, recognizing, and correcting defects which occur during the wafer manufacturing process.

SUMMARY

Implementations described herein generally relate to improving silicon wafer manufacturing. In one embodiment, a method includes receiving information describing a defect. The method further includes identifying a critical area of a silicon wafer and determining the probability of the defect occurring in the critical area. The method further includes determining, based on the probability, the likelihood of an open or a short occurring as a result of the defect occurring in the critical area. The method further includes providing, based on the likelihood, predictive information to a manufacturing system, wherein corrective action is taken based on the predictive information in order to improve silicon wafer manufacturing.

In another implementation, a computer system is provided, which comprises a memory and a processor configured to perform a method for improving silicon wafer manufacturing. In one embodiment, the method includes receiving information describing a defect. The method further includes identifying a critical area of a silicon wafer and determining the probability of the defect occurring in the critical area. The method further includes determining, based on the probability, the likelihood of an open or a short occurring as a result of the defect occurring in the critical area. The method further includes providing, based on the likelihood, predictive information to a manufacturing system, wherein corrective action is taken based on the predictive information in order to improve silicon wafer manufacturing.

In yet another implementation, a non-transitory computer-readable medium is provided, which comprises instructions to perform a method for improving silicon wafer manufacturing. In one embodiment, the method includes receiving information describing a defect. The method further includes identifying a critical area of a silicon wafer and determining the probability of the defect occurring in the critical area. The method further includes determining, based on the probability, the likelihood of an open or a short occurring as a result of the defect occurring in the critical area. The method further includes providing, based on the likelihood, predictive information to a manufacturing system, wherein corrective action is taken based on the predictive information in order to improve silicon wafer manufacturing.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
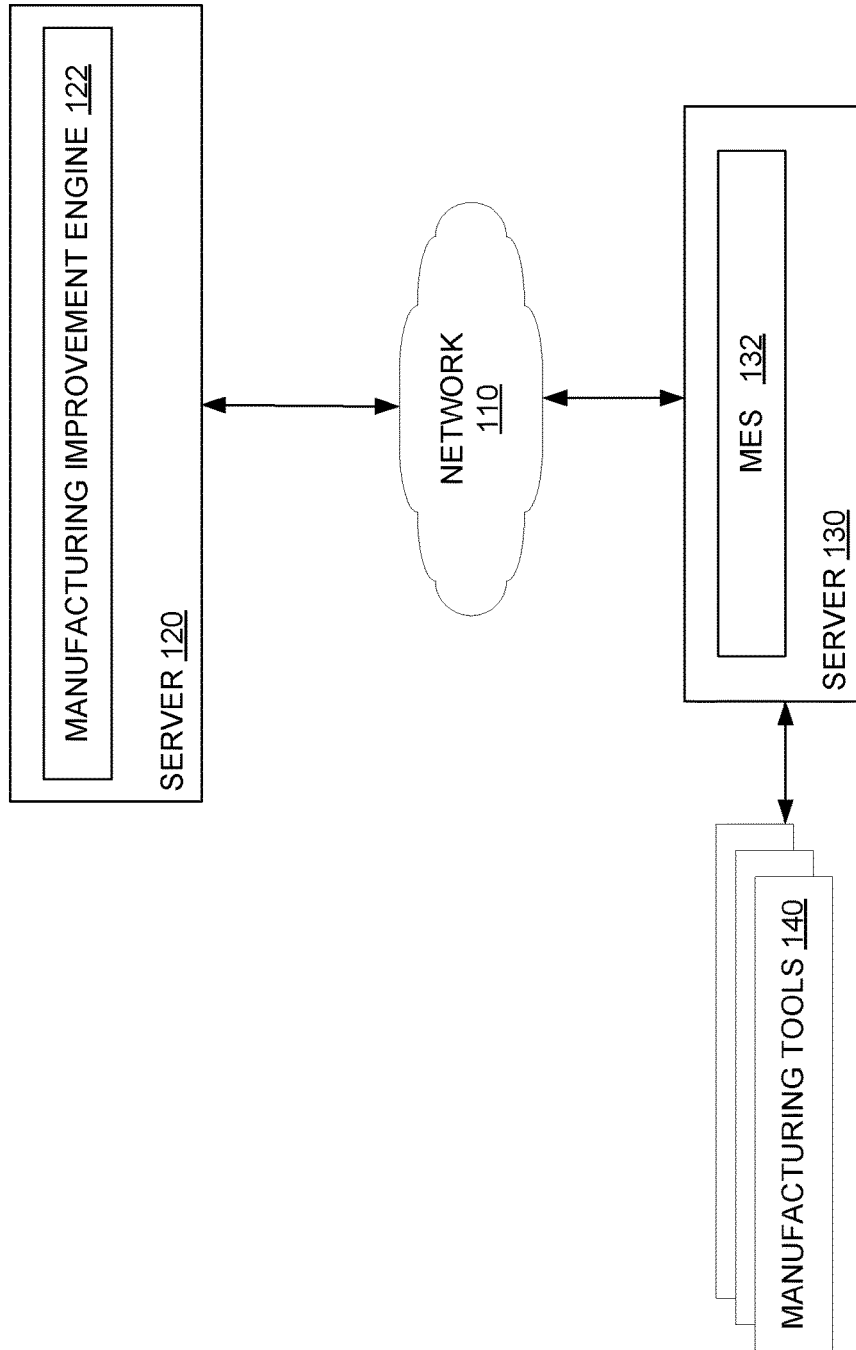
FIG. 1 depicts a network environment in which embodiments of the present disclosure may be implemented.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes methods for data management and mining to correlate wafer alignment, design, defect, process, tool, and metrology data for improving a yield of silicon wafers. Certain details are set forth in the following description and in FIGS. 1-5 to provide a thorough understanding of various implementations of the disclosure. Other details describing well-known structures and systems often associated with plasma etching are not set forth in the following disclosure to avoid unnecessarily obscuring the description of the various implementations.

Many of the details, dimensions, components, and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

In semiconductor fabrication, each step must be performed with a sufficient level of precision so that the resulting product works correctly. Certain defects which occur during the lithography, etching, deposition, or planarization steps may require significant corrective actions in order to rework the wafer. For example, if a substantial misalignment occurs during lithography, in certain cases the wafer must be stripped and lithography must be redone in order to correct the defect. Correcting these defects may result in substantial increases in time and cost. In some cases, simply identifying and correcting every defect after it has occurred is inefficient and may not address underlying systematic defects which are causing or contributing to the individual defects which are occurring. For example, a problem with a parameter of a lithography machine may be causing the same alignment problem to occur repeatedly. As another example, an alignment problem with overlay marks on one layer may cause alignment issues on all subsequent layers. Also, not all defects are substantial enough to require correction. For example, the presence of a dust particle on one part of the wafer may cause problems, while it may not be an issue on another part of the wafer. Certain alignment issues may also not be significant enough to require corrective action. Therefore, there is a need for a more intelligent way to address defects which occur during the manufacturing process.

Embodiments of the present disclosure involve gathering data about silicon wafers and defects from various manufacturing tools associated with a manufacturing execution system (MES). The data may include, for example, alignment data, chip design data, defect data, information about the manufacturing process, information about the manufacturing tools, and metrology data. The data may be aggregated and analyzed at a central location, such as a server, and used to make various determinations related to the manufacturing process and defects. For example, correlations between defects and manufacturing tool parameters may indicate that the defects are the result of a systematic problem, and analysis of the information about the manufacturing process may reveal the source of systematic problems. Furthermore, the data may be used to predict the number and type of defects which are likely to occur in a given set of wafers, as well as the probability that those defects will require reworking the wafers (e.g., stripping and recoating to correct an alignment defect). In some embodiments, these predictions and determinations may be made using stochastic-based methods. Predictive information may then be provided from the server to the MES so that the predictive information can be analyzed by engineers and so that corrective action may be taken regarding problems which are identified. In some embodiments, the MES may automatically take corrective action (e.g., recalibrating or adjusting a parameter of a lithography tool) based on the predictive information.

Furthermore, when a particular defect is identified by the MES (e.g., an optical scanning tool identifies an alignment defect), the MES may provide information about the defect to the server, which may analyze the defect information in view of all of the information maintained by the server (e.g., the alignment data, chip design data, defect data, information about the manufacturing process, information about the manufacturing tools, and metrology data described above). The server may then determine whether the defect requires corrective action. For example, the server may determine based on all of its data that a particular alignment defect is not substantial enough to cause a problem, and may return instructions to the MES indicating that corrective action does not need to be taken. If the server determines that the defect does require corrective action (e.g., that a wafer should be stripped and recoated due to an alignment defect), it may return instructions describing the corrective action to be taken. In some embodiments, the MES may automatically take the corrective action described. In certain embodiments, predictive information and corrective instructions may also be provided to additional systems related to manufacturing silicon wafers (e.g., automated control systems).

FIG. 1 depicts a network environment 100 in which embodiments of the present disclosure may be implemented. As shown, network environment 100 includes a server 120 which is connected via network 110 to another server 130 which is connected to one or more manufacturing tools 140. Network 110 may, for example, comprise the Internet. In another embodiment, manufacturing tools 140 are also connected directly to server 120.

Server 120 may comprise a computing device such as a rack server, desktop or laptop computer, mobile phone, tablet, and the like. As shown, server 120 comprises a manufacturing improvement engine 122, which may perform operations described herein related to making determinations and predictions regarding defects in the wafer manufacturing process. For example, manufacturing improvement engine 122 may analyze information received from MES 132 (e.g., alignment data, chip design data, defect data, information about the manufacturing process, information about the manufacturing tools, and metrology data) in order to identify correlations and make predictions about defects.

For example manufacturing improvement engine 122 may receive information from MES 132 about a defect of a certain diameter (e.g., a foreign particle of a certain diameter), and may calculate the probability of a yield impact resulting from the defect. This calculation may involve determining the probability of the defect occurring in a critical area of a wafer (e.g., an area where the defect may cause a problem), and then determining the probability of an open or a short occurring as a result of the defect occurring in a critical area. Furthermore, manufacturing improvement engine 122 may apply filtering, grouping, and analysis algorithms to all of the data acquired from MES 132 in order to identify correlations between information about design, process, defects, thickness, and resistivity of thin film layers and corresponding parameters of manufacturing tools. Correlations between these data points and tool parameters may be used to determine corrective actions to be taken, such as changes to be made to the tool parameters, in order to improve the manufacturing process. Furthermore, predictive information about yield impacts may be useful from a cost and planning perspective. Probabilities and predictive information may be determined using, for example, fundamental statistical processes or stochastic-based analyses such as multilayer regression, components of variation, Markov calculations, hidden Markov calculations, Kolmogorov-Smirnov calculations, or the like. Manufacturing improvement engine 122 may provide predictive information to MES 132.

Manufacturing improvement engine 122 may also make determinations about particular defects based on all of information received from MES 132. For example, manufacturing improvement engine 122 may determine whether a particular defect requires corrective action to be taken. Manufacturing improvement engine 122 may analyze the defect in view of all of the information it has received (e.g., alignment data, chip design data, defect data, information about the manufacturing process, information about the manufacturing tools, and metrology data) in order to determine whether the defect is substantial enough to cause a problem, and then return instructions to MES 132 regarding whether or not to take corrective action.

Server 130 may comprise a computing device such as a rack server, desktop or laptop computer, mobile phone, tablet, and the like. As shown, server 120 comprises an MES 132, which may perform operations described herein related to managing the manufacturing of silicon wafers. For example, MES 132 may coordinate processes performed by a plurality of manufacturing tools 140, and may collect data from these tools (e.g., alignment data, chip design data, defect data, information about the manufacturing process, information about the parameters of manufacturing tools 140, and metrology data). MES 132 may provide this information to manufacturing improvement engine 122 (e.g., over network 110), which may analyze the information and provide predictive information to manufacturing improvement engine 122 in return. In some embodiments manufacturing improvement engine 122 may provide instructions to MES 132 regarding corrective action to take with respect to an individual defect, a manufacturing tool 140, or other aspects of the manufacturing process. In certain embodiments, MES 132 automatically takes corrective action, such as by instructing individual manufacturing tools 140 to perform certain tasks (e.g., instructing a lithography tool to strip and recoat a wafer in order to correct an alignment defect or instructing a deposition tool to alter one or more parameters).

Manufacturing tools 140 may comprise one or more tools which perform processes related to manufacturing silicon wafers. For example, manufacturing tools 140 may include lithography tools (e.g., including mechanical and optical alignment tools), etching tools, deposition tools, and planarization tools. Manufacturing tools 140 may communicate with MES 132 in order to receive instructions and provide information about, for example, wafers, defects, parameters, and the manufacturing process.

Figure 2:
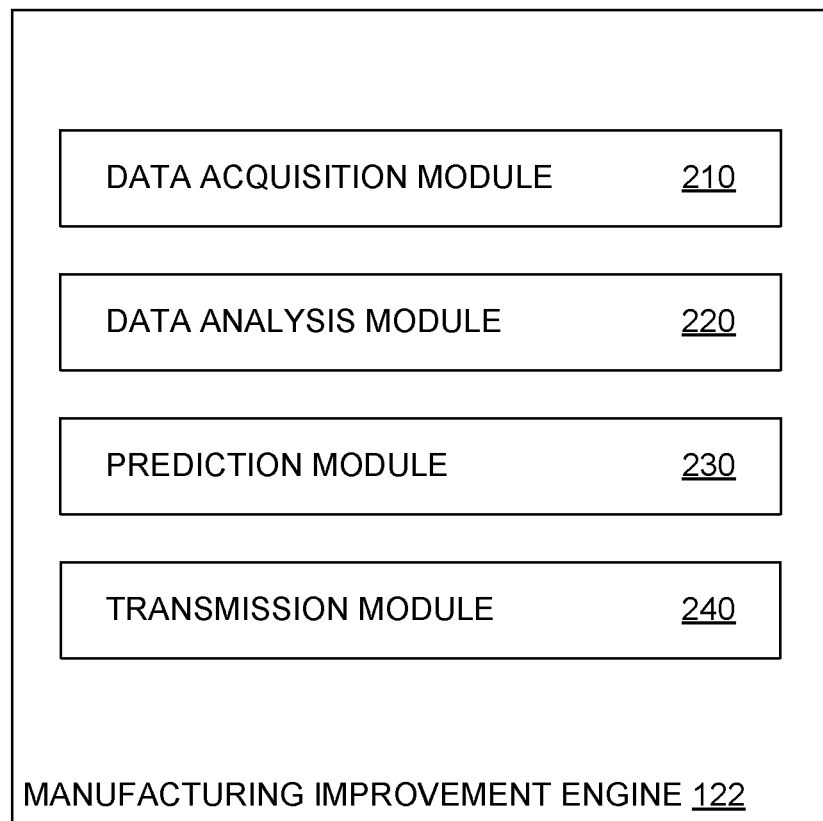
FIG. 2 illustrates components of a manufacturing improvement engine according to embodiments of the present disclosure.

FIG. 2 illustrates components of manufacturing improvement engine 132 according to embodiments of the present disclosure.

As shown, manufacturing improvement engine 122 includes a data acquisition module 210, which may acquire data from MES 132 (e.g., over network 110). Manufacturing improvement engine 122 further includes a data analysis module 220, which may analyze data received from MES 132 in order to identify correlations and determine probabilities of defects occurring in critical areas and causing opens or shorts. Manufacturing improvement engine 122 further includes a prediction module 230, which may make predictions about yield impacts and other aspects of the manufacturing process based on determinations made by data analysis module 220. Data analysis module 220 and prediction module 230 may, for example, make determinations based on fundamental statistical processes and stochastic-based analyses of data received from MES 132. Manufacturing improvement engine 122 further includes a transmission module 240, which may transmit data such as predictive information and corrective instructions to MES 132 (e.g., over network 110).

It is noted that the components shown in FIG. 2 are merely exemplary, and the operations described herein may be implemented by any combination of local or distributed components.

Figure 3:
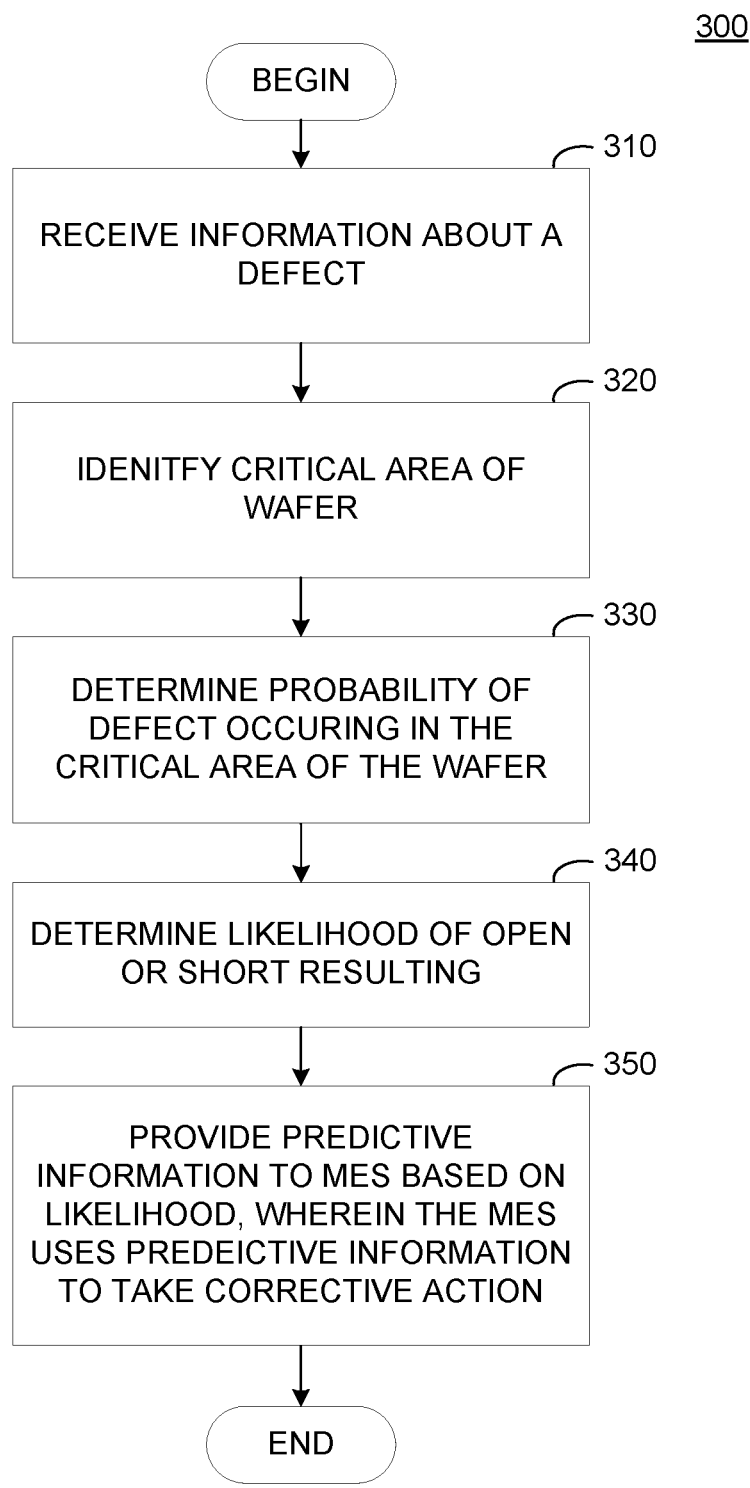
FIG. 3 illustrates example operations for improving silicon wafer manufacturing according to embodiments of the present disclosure.

FIG. 3 illustrates example operations 300 for improving manufacturing of silicon wafers, according to embodiments of the present disclosure. Operations 300 may be performed, for example, by manufacturing improvement engine 122.

At 310, manufacturing improvement engine 122 receives information about a defect. For example, manufacturing improvement engine 122 may receive information from MES 132, acquired from one or manufacturing tools 140, about a defect of a particular diameter on a silicon wafer.

At 320, manufacturing improvement engine 122 identifies a critical area of a wafer. For example, manufacturing improvement engine 122 may use additional information received from MES 132 (e.g., alignment data, chip design data, defect data, information about the manufacturing process, information about the manufacturing tools, and metrology data) in order to determine an area of a wafer in which the defect may cause a problem (e.g., an open or a short).

At 330, manufacturing improvement engine 122 determines the probability of the defect occurring in the critical area identified at 320. For example, manufacturing improvement engine 122 may use probability calculations based on the information received from MES 132 in order to determine the probability of this particular defect occurring in the particular critical area of a given wafer.

At 340, manufacturing improvement engine 122 determines the likelihood of an open or short resulting if the defect occurred in the critical area. The likelihood may be determined based on fundamental statistical processes or stochastic-based analyses of all of the data received from MES 132.

At 350, manufacturing improvement engine 122 provides predictive information to MES 132 based on the likelihood determined at 340. The predictive information may identify the probability of a yield impact based on the above calculations, and may identify additional information about the numbers and types of defects likely to occur in a given set of wafers. In certain embodiments, the predictive information may also be accompanied by instructions regarding corrective action to be taken. In some embodiments, MES 132 automatically takes corrective action based on the predictive information. In other embodiments, engineers and strategists may analyze the predictive information in order to identify ways to improve the manufacturing process.

Figure 4:
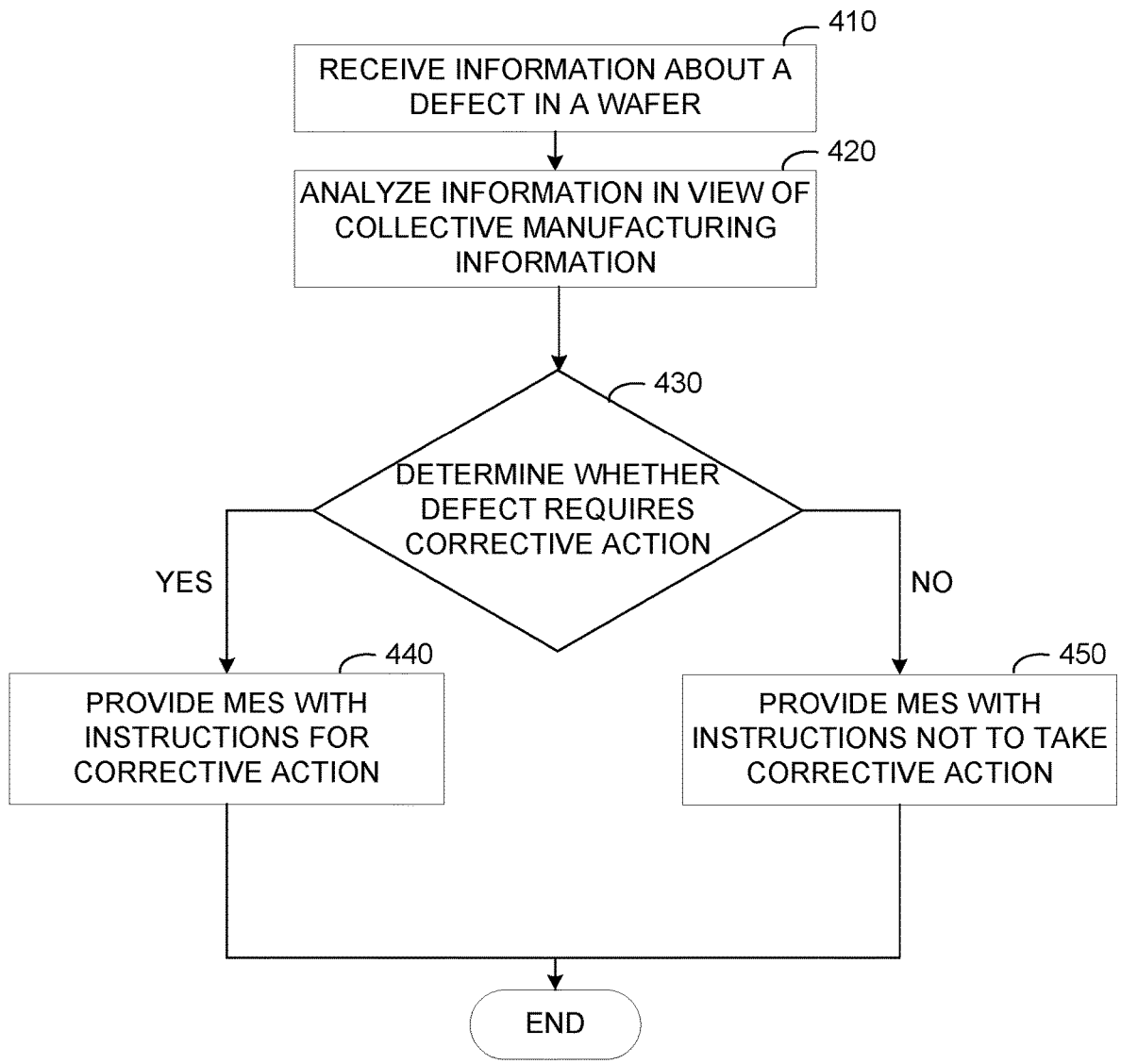
FIG. 4 further illustrates example operations for improving silicon wafer manufacturing according to embodiments of the present disclosure.

FIG. 4 illustrates example operations 400 for improving manufacturing of silicon wafers, according to embodiments of the present disclosure. Operations 400 may be performed, for example, by manufacturing improvement engine 122.

At 410, manufacturing improvement engine 122 receives information about a defect in a wafer. For example, manufacturing improvement engine 122 may receive information from MES 132 about a defect (e.g., an alignment defect) identified by a manufacturing tool 140 in a wafer.

At 420, manufacturing improvement engine 122 analyzes the defect information in view of all of the information it has acquired related to the manufacturing process (e.g., alignment data, chip design data, defect data, information about the manufacturing process, information about the manufacturing tools, and metrology data). For example, manufacturing improvement engine 122 may use fundamental statistical processes or stochastic-based analyses to identify correlations in the information.

At 430, manufacturing improvement engine 122 determines whether the defect requires corrective action. For example, manufacturing improvement engine 122 may determine whether the defect is in a critical area of the wafer and/or whether the defect is substantial enough to cause a problem (e.g., an open or a short). This determination may be made in view of the analysis performed at 420. If manufacturing improvement engine 122 determines that the defect requires corrective action, operations continue at 440. Otherwise, operations continue at 450.

At 440, having determined that the defect requires corrective action, manufacturing improvement engine 122 provides the MES 132 with instructions for taking corrective action. For example, manufacturing improvement engine 122 may determine that the defect is in a critical area, and that it is likely to cause an open or a short (e.g., the probability of an open or short occurring is above a certain threshold). The instructions may, for example, describe actions to be performed in order to correct the defect (e.g., adjusting an overlay mark to the correct location, stripping and recoating the wafer, making an adjustment to a tool parameter, or the like). In some embodiments, the instructions are used by MES 132 to automatically take the corrective action. In other embodiments, the instructions may be used by an engineer to take corrective action.

At 450, having determined that the defect does not require corrective action, manufacturing improvement engine 122 provides the MES 132 with instructions not to take corrective action. For example, manufacturing improvement engine 122 may determine that the defect is not likely to cause a problem (e.g., because it is not in a critical area or it is small enough that the probability of an open or short resulting is below a certain threshold). MES 132 may, for example, take no action in response to the instructions.

Figure 5:
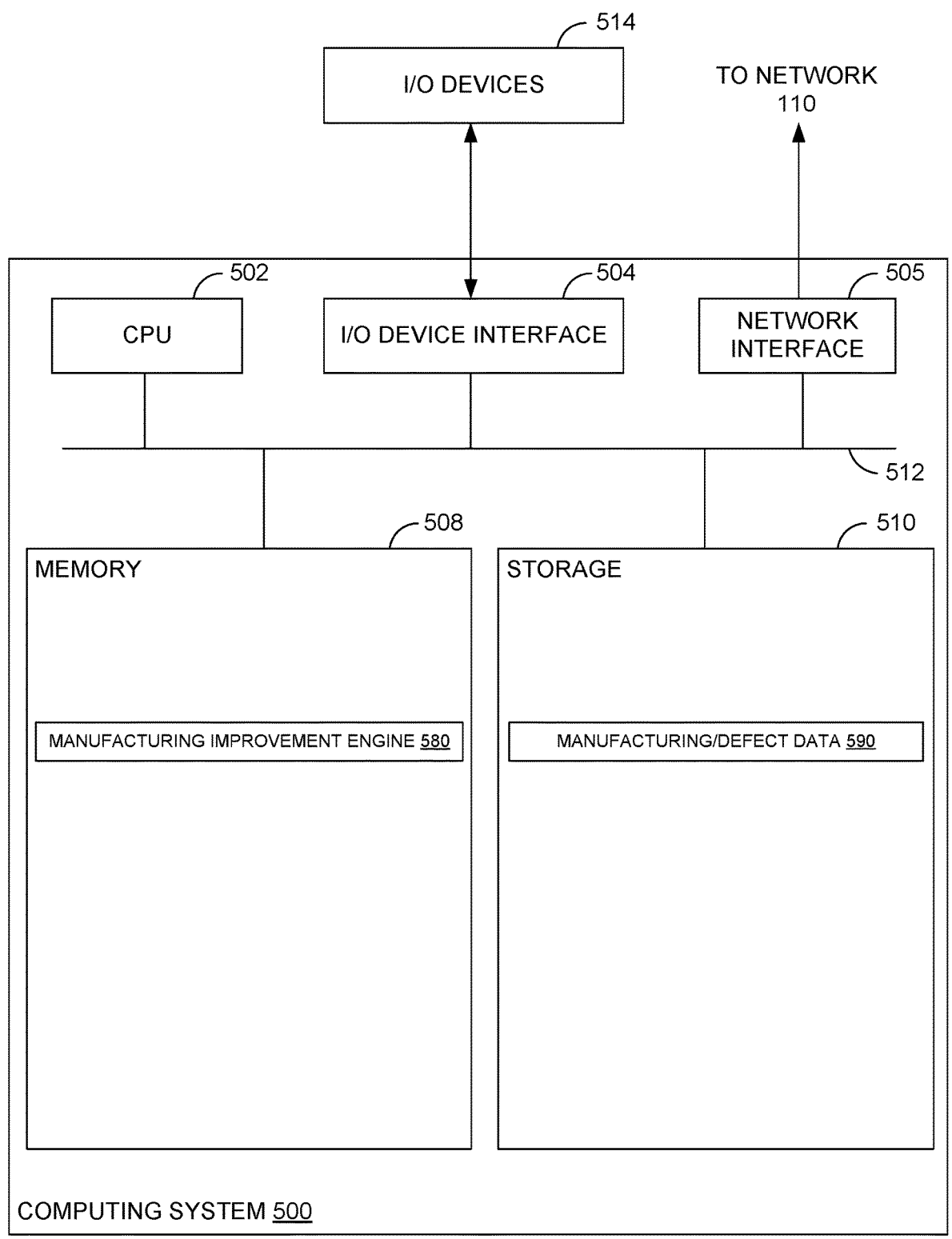
FIG. 5 depicts an example computer system with which embodiments of the present disclosure may be implemented.

FIG. 5 illustrates an example computing system 500 used to improve manufacturing of silicon wafers, according to some embodiments of the present disclosure. In certain embodiments, computer system 500 is representative of a server 120. Aspects of computer system 500 may also be representative of other devices used to perform techniques described herein (e.g., server 130).

As shown, the computing system 500 includes, without limitation, a central processing unit (CPU) 505, a network interface 515, a memory 520, and storage 530, each connected to a bus 517. The computing system 500 may also include an I/O device interface 510 connecting I/O devices 512 (e.g., keyboard, display and mouse devices) to the computing system 500. Further, the computing elements shown in computing system 500 may correspond to a physical computing system (e.g., a system in a data center) or may be a virtual computing instance executing within a computing cloud.

The CPU 505 retrieves and executes programming instructions stored in the memory 520 as well as stored in the storage 530. The bus 517 is used to transmit programming instructions and application data between the CPU 505, I/O device interface 510, storage 530, network interface 515, and memory 520. Note, CPU 505 is included to be representative of a single CPU, multiple CPUs, a single CPU having multiple processing cores, and the like, and the memory 520 is generally included to be representative of a random access memory. The storage 530 may be a disk drive or flash storage device. Although shown as a single unit, the storage 530 may be a combination of fixed and/or removable storage devices, such as fixed disc drives, removable memory cards, optical storage, network attached storage (NAS), or a storage area-network (SAN).

Illustratively, the memory 520 includes a manufacturing improvement engine 580, which performs operations related to improving manufacturing of silicon wafers, according to techniques described herein. For example, manufacturing improvement engine 580 may be equivalent to manufacturing improvement engine 122 in FIG. 1, and may use fundamental statistical processes and stochastic-based analyses to make predictive determinations regarding defects and other aspects of manufacturing silicon wafers.

Illustratively, the storage 520 includes manufacturing/defect data 590, which may comprise information acquired by manufacturing improvement engine 580. Manufacturing/defect data 590 may, for example, comprise information received from MES 132, collected by manufacturing tools 140, related to defects and manufacturing processes (e.g., alignment data, chip design data, defect data, information about the manufacturing process, information about the manufacturing tools, and metrology data).

Advantageously, the techniques presented herein allow for intelligent decisions to be made regarding corrective actions to be taken with respect to defects and other aspects of the manufacturing process. Use of embodiments of the present disclosure may reduce costs, improve efficiency, and allow for better strategic planning with respect to the manufacturing process.

In the preceding, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples a computer readable storage medium include: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the current context, a computer readable storage medium may be any tangible medium that can contain, or store a program.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to embodiments of the present disclosure, other and further embodiments of the disclosure may be devised without departing from the basic scope thereof, and the scope thereof is determined by the claims that follow.

The invention claimed is:

1. A method for improving silicon wafer manufacturing, comprising:
   receiving information describing a defect of a given diameter;
   receiving manufacturing process information comprising alignment data;
   identifying a critical area of a silicon wafer, wherein the critical area is an area in which an open or a short is possible as a result of the defect of the given diameter;
   determining a probability of the defect occurring in the critical area based on a statistical analysis of the manufacturing process information and the information describing the defect of the given diameter;
   determining, based on the probability, a likelihood of the open or the short occurring as a result of the defect occurring in the critical area; and
   providing, based on the likelihood, predictive information to a manufacturing system, wherein corrective action is taken based on the predictive information in order to improve silicon wafer manufacturing, and wherein the corrective action comprises one or more of:
   adjusting an alignment of a wafer;
   a stripping and recoating action; or
   adjusting a tool parameter.

2. The method of claim 1, wherein at least one of the probability and the likelihood is calculated using stochastic-based analysis.

3. The method of claim 2, wherein the stochastic-based analysis comprises analyzing a collection of information related to manufacturing and defects, including the manufacturing process information and the information describing the defect of the given diameter.

4. The method of claim 3, wherein the collection of information comprises one or more parameters of one or more manufacturing tools.

5. The method of claim 3, wherein the collection of information comprises metrology data.

6. The method of claim 1, wherein the predictive information comprises a prediction regarding a yield impact.

7. The method of claim 1, wherein the predictive information comprises instructions to perform one or more corrective actions.

8. A computing system, comprising:
   a memory; and
   a processor configured to perform a method for improving silicon wafer manufacturing, the method comprising:
   receiving information describing a defect of a given diameter;
   receiving manufacturing process information comprising alignment data;
   identifying a critical area of a silicon wafer, wherein the critical area is an area in which an open or a short is possible as a result of the defect of the given diameter;
   determining a probability of the defect occurring in the critical area based on a statistical analysis of the manufacturing process information and the information describing the defect of the given diameter;
   determining, based on the probability, a likelihood of the open or the short occurring as a result of the defect occurring in the critical area; and
   providing, based on the likelihood, predictive information to a manufacturing system, wherein corrective action is taken based on the predictive information in order to improve silicon wafer manufacturing, and wherein the corrective action comprises one or more of:
   adjusting an alignment of a wafer;
   a stripping and recoating action; or
   adjusting a tool parameter.

9. The computing system of claim 8, wherein at least one of the probability and the likelihood is calculated using stochastic-based analysis.

10. The computing system of claim 9, wherein the stochastic-based analysis comprises analyzing a collection of information related to manufacturing and defects, including the manufacturing process information and the information describing the defect of the given diameter.

11. The computing system of claim 10, wherein the collection of information comprises one or more parameters of one or more manufacturing tools.

12. The computing system of claim 10, wherein the collection of information comprises metrology data.

13. The computing system of claim 8, wherein the predictive information comprises a prediction regarding a yield impact.

14. The computing system of claim 8, wherein the predictive information comprises instructions to perform one or more corrective actions.

15. A non-transitory computer-readable medium comprising instructions that when executed by a computing device cause the computing device to perform a method for improving silicon wafer manufacturing, the method comprising:
   receiving information describing a defect of a given diameter;
   receiving manufacturing process information comprising alignment data;
   identifying a critical area of a silicon wafer, wherein the critical area is an area in which an open or a short is possible as a result of the defect of the given diameter;
   determining a probability of the defect occurring in the critical area based on a statistical analysis of the manufacturing process information and the information describing the defect of the given diameter;
   determining, based on the probability, a likelihood of the open or the short occurring as a result of the defect occurring in the critical area; and
   providing, based on the likelihood, predictive information to a manufacturing system, wherein corrective action is taken based on the predictive information in order to improve silicon wafer manufacturing, and wherein the corrective action comprises one or more of:
   adjusting an alignment of a wafer;
   a stripping and recoating action; or
   adjusting a tool parameter.

16. The non-transitory computer-readable medium of claim 15, wherein at least one of the probability and the likelihood is calculated using stochastic-based analysis.

17. The non-transitory computer-readable medium of claim 16, wherein the stochastic-based analysis comprises analyzing a collection of information related to manufacturing and defects, including the manufacturing process information and the information describing the defect of the given diameter.

18. The non-transitory computer-readable medium of claim 17, wherein the collection of information comprises one or more parameters of one or more manufacturing tools.

19. The non-transitory computer-readable medium of claim 17, wherein the collection of information comprises metrology data.

20. The non-transitory computer-readable medium of claim 15, wherein the predictive information comprises a prediction regarding a yield impact.

21. The non-transitory computer-readable medium of claim 15, wherein the predictive information comprises instructions to perform one or more corrective actions.

* * * * *